United States Patent
Hougham et al.

(10) Patent No.: US 7,708,909 B2
(45) Date of Patent: *May 4, 2010

(54) SELF ORIENTING MICRO PLATES OF THERMALLY CONDUCTING MATERIAL AS COMPONENT IN THERMAL PASTE OR ADHESIVE

(75) Inventors: Gareth Hougham, Ossining, NY (US);
Paul A. Lauro, Brewster, NY (US);
Brian R. Sundlof, Verbank, NY (US);
Jeffrey D. Gelorme, Burlington, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/039,309

(22) Filed: Feb. 28, 2008

(65) Prior Publication Data
US 2008/0202386 A1   Aug. 28, 2008

Related U.S. Application Data

(63) Continuation of application No. 10/986,665, filed on Nov. 12, 2004, now Pat. No. 7,351,360, and a continuation of application No. 11/758,457, filed on Jun. 5, 2007.

(51) Int. Cl.
H01B 1/04   (2006.01)

(52) U.S. Cl. .............. 252/502; 252/510; 252/518.1; 252/519.33; 428/297.4; 423/414; 423/445 R; 423/448; 977/788

(58) Field of Classification Search ......... 252/500–514, 252/518.1, 519.33; 428/297.4; 423/414, 423/445 R, 448; 977/788
See application file for complete search history.

(56) References Cited

U.S. PATENT DOCUMENTS

| | | | |
|---|---|---|---|
| 7,132,062 | B1 | 11/2006 | Howard |
| 7,238,415 | B2 | 7/2007 | Rodriguez et al. |
| 2002/0054849 | A1 | 5/2002 | Baker et al. |
| 2003/0096104 | A1 | 5/2003 | Tobita et al. |
| 2004/0127621 | A1 | 7/2004 | Drzal et al. |
| 2004/0262584 | A1 | 12/2004 | Bonnet et al. |
| 2005/0124504 | A1 | 6/2005 | Zhang et al. |

FOREIGN PATENT DOCUMENTS

FR   03/067686   8/2003

*Primary Examiner*—Mark Kopec
*Assistant Examiner*—Tri V Nguyen
(74) *Attorney, Agent, or Firm*—Connolly Bove Lodge & Hutz LLP; Louis J. Percello

(57) ABSTRACT

The present invention relates generally to thermally-conductive pastes for use with integrated circuits, and particularly, but not by way of limitation, to self-orienting microplates of graphite.

14 Claims, 8 Drawing Sheets

A=good. Will self orient basil plane relative to heat flow direction
B=good. Will still self orient
C=Not good. Now pieces are in shape that will rotate to lie flat and adopt the wrong orientation
D=Not good. Same as C shown after orientation

SELF ORIENTING MICRO PLATES OF THERMALLY CONDUCTING MATERIAL AS COMPONENT IN THERMAL PASTE OR ADHESIVE

CROSS REFERENCE TO RELATED APPLICATIONS

This application is a continuation of application Ser. No. 10/986,665, filed Nov. 12, 2004, now U.S. Pat. No. 7,351,360 and a continuation of co-pending Application No. 11/758,457, filed on Jun. 5, 2007, the entire contents of which are hereby incorporated by reference.

FIELD OF THE INVENTION

The present invention relates generally to thermally-conductive pastes for use with integrated circuits, and particularly, but not by way of limitation, to self-orienting microplates of graphite.

BACKGROUND

The information provided below is not admitted to be prior art to the present invention, but is provided solely to assist the understanding of the reader.

Computer chips operate at ever greater power densities as circuits are packed more and more closely together. This higher power density can not be effectively accommodated by traditional methods of cooling. Higher power consumption without concomitant heat removal leads to higher chip operating temperatures which can result in severe reliability, performance, and lifetime concerns. FIG. 1 shows a schematic of a conventional cooling solution comprising a chip mounted on a ceramic module and a heat transfer paste applied to the top surface of the chip and squeezed against a heat sink. This creates a sandwich of a thermal paste between the chip and the heat sink. Heat sinks typically have fin structures that transfer heat, generated by the chip, to air, blown across the fins by a fan. The rate of heat transfer of such cooling designs is limited by the thermal conductivity of the gap filling material. There exists a need to provide heat-transfer pastes having improved thermal conductivity properties.

SUMMARY OF INVENTION

The present invention provides platelet and/or disk shaped particles of a conducting material as a component of a thermal paste to maximize heat transfer from one particle to another. An aspect of the present invention provides a conductive material having anisotropic thermal conductive properties. An aspect of the present invention provides a substantially planar heat source and a substantially planar heat sink. An aspect of the present invention provides a thermal conductive paste disposed between the heat source and heat sink wherein the platelets are oriented with the plane of their major surfaces substantially parallel to the plane of the heat source and sink. A further aspect provides that when the platelets are thus oriented, the direction of maximum heat transfer rate is perpendicular to the plane of the heat source and perpendicular to the plane of the heat sink.

An aspect of the present invention provides platelets comprised of oriented graphite. A further aspect of the present invention provides graphite platelets wherein the graphite basal plane (L e. the direction of maximal heat transfer) is perpendicular to the plane of the platelet.

An aspect of the present invention provides a paste comprising thermally-anisotropic platelets suspended in a liquid. A further aspect of the present invention provides a liquid component which may be an oil or a liquid metal. In an aspect, the oil comprises a polyalphaolefin (PAO) oil. In an aspect, the liquid metal may be a gallium/indium eutectic or a gallium/indium/tin eutectic. In a further aspect, the liquid metal may be a solder.

A further aspect provides the conductive platelets are coated with a thin layer of a metal or other conductive material. In an aspect, the coating serves to strengthen the platelets against fracture. In an aspect, the coating serves to make the platelets more wettable by a liquid matrix. In an aspect, the coating serves to make the platelet surface more compatible with a solder matrix both in terms of wetting and fusing. According to an aspect of the present invention, the coating may be a thin layer of a metal. According to a preferred, but not limiting, aspect, the metal may be copper, gold, or nickel. According to a further aspect, the surface of the platelets may be provided any of a number of commonly used surface treatments, such as, but not limited to: plasma oxidation, plasma sulfonation, ozone treatments in the presence or absence of ultraviolet light, alkaline surface hydrolysis, silanation, (treatment with any number of silane containing substances such as hexamethyl silyl disilizane, or trimethoxysilylpropyl amine), and plasma ammonia treatment. According to a further aspect, the coating may be deposited by any conventional method. Suitable methods include, but are not limited to, CVD of powders suspended in fluidized bed reactors, electroless or electroplating, dipping and drying, plasma processing, and spraying.

According to an aspect, the present invention provides a paste composition having anisotropic thermal transmission characteristics comprising: platelets of a material having a basal plane in a z-direction with a first length and a platelet plane having second and third lengths in an x- and a y-direction respectively, said second and third lengths larger than said first length; and a liquid. According to an aspect the basal plane defines the direction of maximal thermal conductivity.

According to an aspect, the present invention provides a paste composition, wherein the platelets comprise a graphite selected from the group consisting of single crystal graphite, multiwall carbon nanotubes, oriented pyrrolytic graphite fibers, and rolled grapheme films. According to a further aspect, the graphite is isotopically-enriched to have a content of $^{12}C$ above the natural abundance. According to a further aspect, the graphite consists essentially of isotopically pure $^{12}C$. According to a further aspect, the graphite is isotopically-enriched to have a content of $^{13}C$ above the natural abundance. According to a further aspect, the graphite consists essentially of isotopically pure $^{13}C$.

Still other aspects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

The term "graphitic" comprehends pure graphite, as well as material that is "substantially graphite," as well a material having graphite character.

Reference is made to the figures to illustrate selected embodiments and preferred modes of carrying out the invention. It is to be understood that the invention is not hereby limited to those aspects depicted in the figures.

Figure 1:
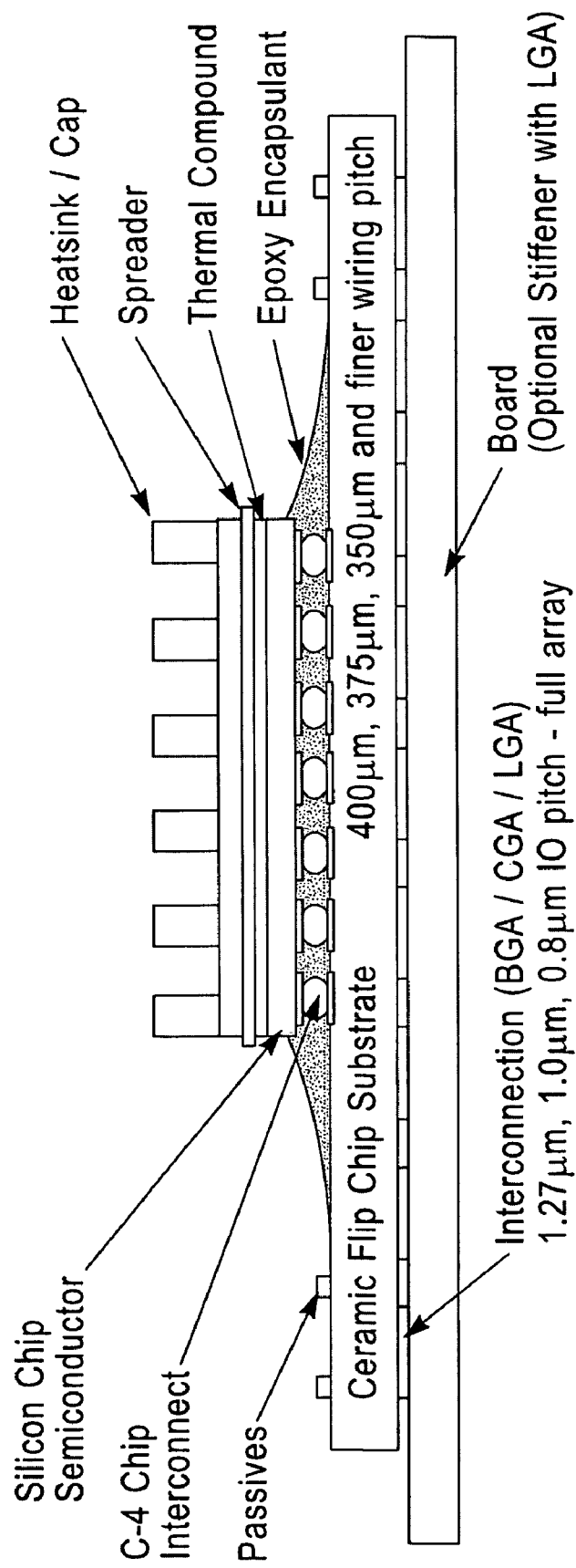
FIG. 1 is a schematic of a chip mounted on a ceramic module, a heat transfer paste applied to the top surface of the chip, and squeezed against a heat sink.
Figure 2:
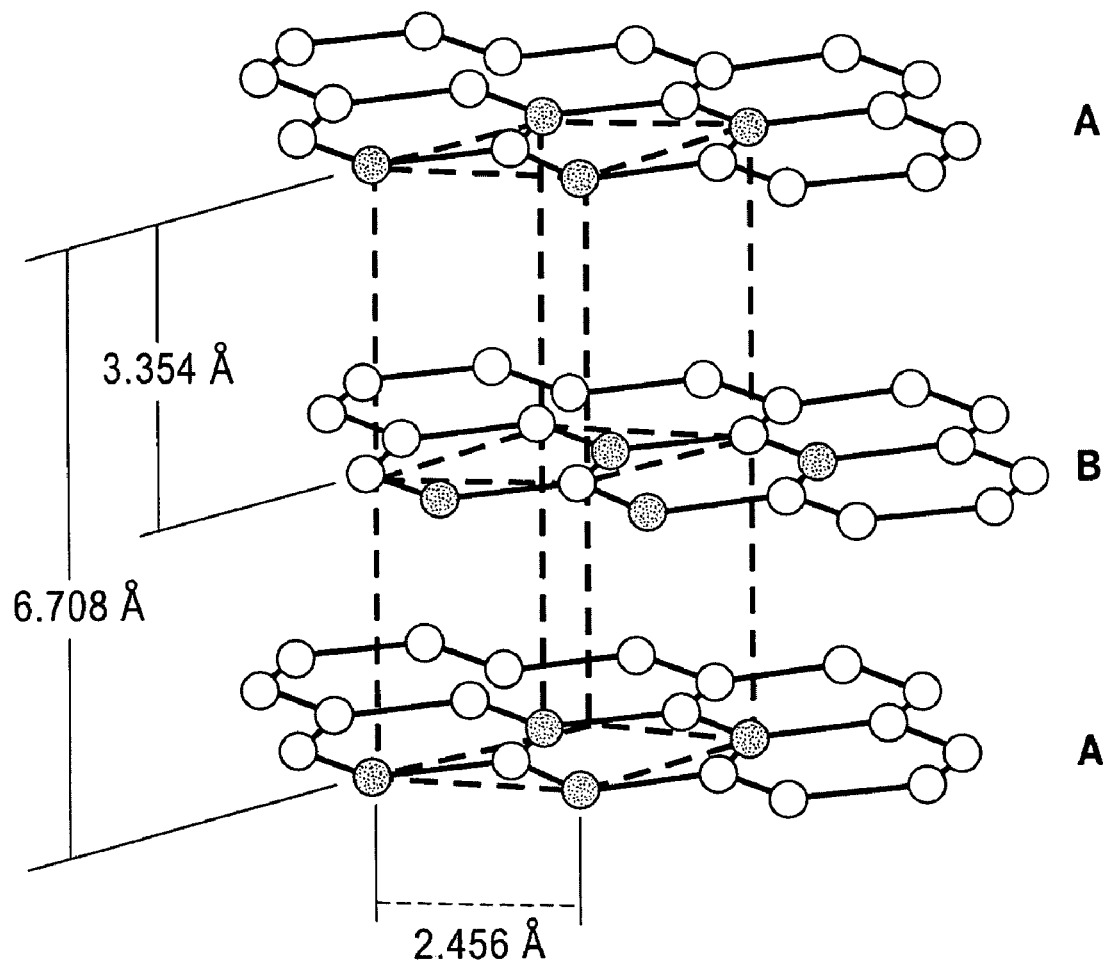
FIG. 2 depicts the crystal structure of graphite.

Graphite is anisotropic with respect to thermal conductivity. The thermal conductivity in the basal plane of graphite (the so called graphitic plane) is extraordinarily high. Typically, the conductivity parallel to the basal plane is about 2000 W/m-K. These values are comparable to those of diamond, the best-known thermal conductor. However, values for the conductivity perpendicular to the graphitic plane are typically about two orders of magnitude lower, or roughly 10 W/m-K. FIG. 2 illustrates the basal plane of graphite. The basal plane is defined by the plane of the C—C covalent bonds.

Thermal pastes comprising randomly-oriented, ground pyrollitic graphite powders having an average thermal conductivity of about 100 W/m-K are conventional to the art. A conductivity of 100 W/m-K is superior to that of most materials. However, the present invention represents an improvement over the art by providing particles oriented such that the basal planes of the particles are aligned in the direction of the desired heat flow (normal to the chip surface). Thus the conductivity of the paste is dramatically improved. The invention is not limited to graphite, but may suitably be practiced with any thermally anisotropic material. Any crystalline substance will have some anisotropy. The invention is advantageously practiced with a crystal, such as graphite, having covalency restricted to a single plane.

The present invention optimizes the thermal conductivity of graphite while maintaining particle sizes appropriate for pastes, by providing graphite particles which have a platelet, or plate-like, shape and where the graphitic plane is oriented perpendicular to the plane of the platelet. If the aspect ratio of the platelet were optimal, then composites made from such material would have a preponderance of platelets stacked, or self oriented, in this preferred orientation. The absolute size of these particles can vary for different purposes. However, a platelet shape is always desired for processing purposes, and is defined by an optimum aspect ratio (platelet flatness), which is the ratio of platelet thickness to the two length dimensions.

There are competing motivations for keeping the particles large or small on an absolute size basis. The larger they are, the fewer the number of interfaces that must be crossed in a given thermal path. This improves conductivity, as an interface nearly always impedes thermal transport. The smaller they are, the more particle-like the platelets become. Pastes made from smaller particles are better able to conform to non-uniformities in the gap between the heat source and the heat sink. The more the paste conforms to the gap between the source and sink, the better will be Graphite is anisotropic with respect to thermal conductivity. The thermal conductivity in the basal plane of graphite (the so called graphitic plane) is extraordinarily high. Typically, the conductivity parallel to the basal plane is about 2000 W/m-K. These values are comparable to those of diamond, the best-known thermal conductor. However, values for the conductivity perpendicular to the graphitic plane are typically about two orders of magnitude lower, or roughly 10 W/m-K. FIG. 2 illustrates the basal plane of graphite. The basal plane is defined by the plane of the C—C covalent bonds.

Thermal pastes comprising randomly-oriented, ground pyrollitic graphite powders having an average thermal conductivity of about 100 W/m-K are conventional to the art. A conductivity of 100 W/m-K is superior to that of most materials. However, the present invention represents an improvement over the art by providing particles oriented such that the basal planes of the particles are aligned in the direction of the desired heat flow (normal to the chip surface). Thus the conductivity of the paste is dramatically improved. The invention is not limited to graphite, but may suitably be practiced with any thermally anisotropic material. Any crystalline substance will have some anisotropy. The invention is advantageously practiced with a crystal, such as graphite, having covalency restricted to a single plane.

The present invention optimizes the thermal conductivity of graphite while maintaining particle sizes appropriate for pastes, by providing graphite particles which have a platelet, or plate-like, shape and where the graphitic plane is oriented perpendicular to the plane of the platelet. If the aspect ratio of the platelet were optimal, then composites made from such material would have a preponderance of platelets stacked, or self oriented, in this preferred orientation. The absolute size of these particles can vary for different purposes. However, a platelet shape is always desired for processing purposes, and is defined by an optimum aspect ratio (platelet flatness), which is the ratio of platelet thickness to the two length dimensions.

There are competing motivations for keeping the particles large or small on an absolute size basis. The larger they are, the fewer the number of interfaces that must be crossed in a given thermal path. This improves conductivity, as an interface nearly always impedes thermal transport. The smaller they are, the more particle-like the platelets become. Pastes made from smaller particles are better able to conform to non-uniformities in the gap between the heat source and the heat sink. The more the paste conforms to the gap between the source and sink, the better will be the thermal conductivity. However, a smaller particle size implies a higher number of interfaces with a concomitant thermal performance penalty.

At the extreme upper size extreme, a single sheet of material can be placed between the source and sink; thus, eliminating all but two interfaces. The single sheet would have virtually no ability to conform to irregularities in the shape of the gap. Thermal transfer would be impeded where the gap remained unfilled. At the lower size extreme, nano-sized particles can be utilized, as long as they have an aspect ratio (thickness (z) to plate length (x and y)) such that they orient with the plane of the plate parallel to the plane of the source and/or sink. A plate of the present invention positioned parallel to the heat source will have its basal plane (the direction of maximum rate of heat transfer) perpendicular to the source and parallel to the direction of heat transfer. Typically, the particle size will be in the micron to mm size range, permitting a reasonable balance of these competing properties—as well as cost and convenience.

Figure 3:
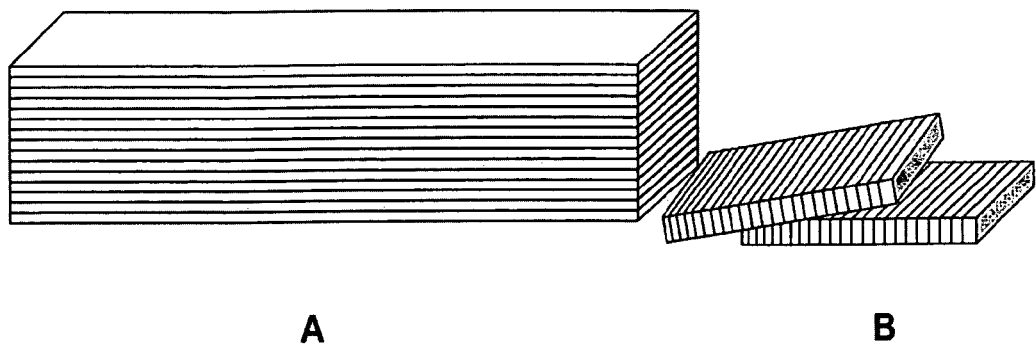
FIG. 3A depicts a boule of single-crystal graphite, the basal planes of which are in the x-y plane of the drawing.
FIG. 3B depicts platelet sections sliced from a boule; the graphite basal plane is oriented perpendicular to the plane of the section.

One approach for larger particles is to cut or slice graphite into sheets from a single crystal boule. In these sheets the graphitic plane must be perpendicular to the plane of the sheet. These can easily be cut to about 10 mil thicknesses by sawing with a diamond blade. FIG. 3 illustrates this where slices are sawed off making platelets. In the figure, the basal (graphitic) plane is shown in the boule to be in the x-y plane of the drawing. After the cut, the platelet is unstable in gravitational or shear force fields and will tip over to lie in a stable position relative to a flat surface. This orients the basal plane of the graphite in the vertical direction or stated another way perpendicular to the flat surface. So oriented, the high conductivity plane is parallel to the direction of heat flow from the heat source to the heat sink.

Often, particles smaller than the boule cross sectional dimension are desired. Graphite sheets may be reduced in size to platelets by any of a variety means. Graphite particles of the present invention have substantially parallel and substantially planar major surfaces. Each major surface has x and y dimension, each larger than the thickness of the platelet. Each platelet is characterized by an aspect ratio—the ratio of the thickness to any of the x or y dimensions. Preferably, each of the x and y dimensions is no smaller than about 5 times the thickness to ensure that the particles will lie flat. The aspect ratio may be as low as 2:1. Though this will be dependent on the details of processing such as how much sheer force is applied during paste application, how much downward force, etc. If a 5:1 aspect ratio is used for illustrative purposes, a 10 mil thick sheet may be ground, or otherwise reduced, until the average particle size was about 50 mil on a side. The resulting powder constitutes the solid component of the thermal paste.

A single crystal graphite block of graphite is shaved or cut perpendicular to the basal plane in thin sheets. As shown in FIG. 3. In an embodiment, 10 mil (1 mil-0.0254 millimeter; -0.001 inch) slices may be made with a diamond saw. In a preferred embodiment, 10 micron slices may be obtained using an automatic microtome which can easily make 10 micron thick cuts and advance the block of source material for each new cut up to thousands of cuts.

Figure 4:
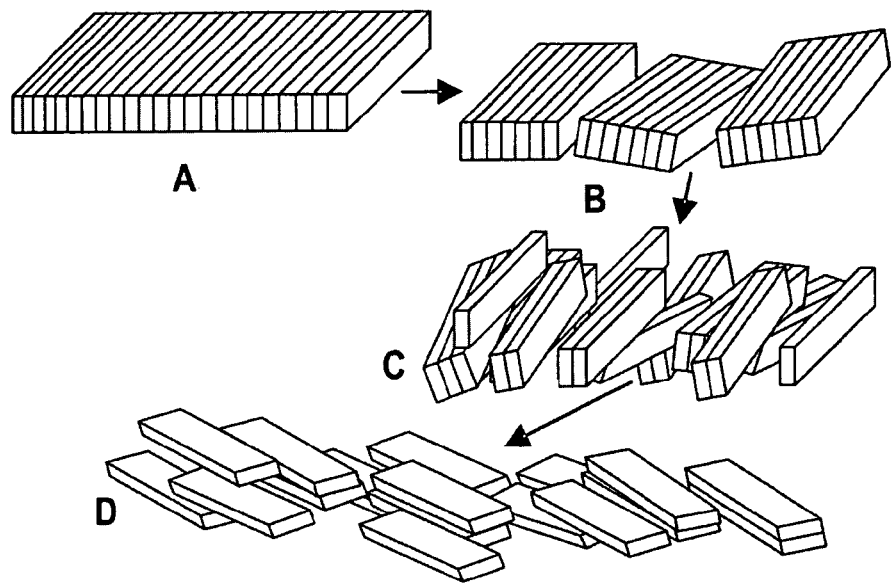
FIG. 4 depicts a platelet section of a boule and smaller pieces derived therefrom.

Thin sheets cut in that way are then ground until either the x or y size is some multiple of the thickness (such as 50 micron for this example for a 10 micron thickness) to assure that the resulting pieces will lie flat with the basal orientation perpendicular to the substrate surface. Since the sliced sheets of graphite will tend to break between the basal planes preferentially (as illustrated in FIG. 4) needle shapes would eventually result. If we designate the needle direction the x direction, and the thickness the z direction, then we need only to make sure to grind until the y direction is no smaller than 50 micron. (i.e., the y direction should be larger than the z direction to make sure the needle or platelet lies such that the basal graphite plane is parallel to the desired direction of heat transfer). This condition is shown in FIG. 4b. If they dimension becomes comparable to or smaller than the z direction, as in FIG. 4c, then the needle would be prone to reorienting to lie on the wrong side, resulting in loss of thermal conductivity, as shown in FIG. 4D.) In FIG. 4, an ideal target level of grinding would be stage B, where the platelets are as small as they can be while remaining stable in the preferred orientation.

Figure 5:
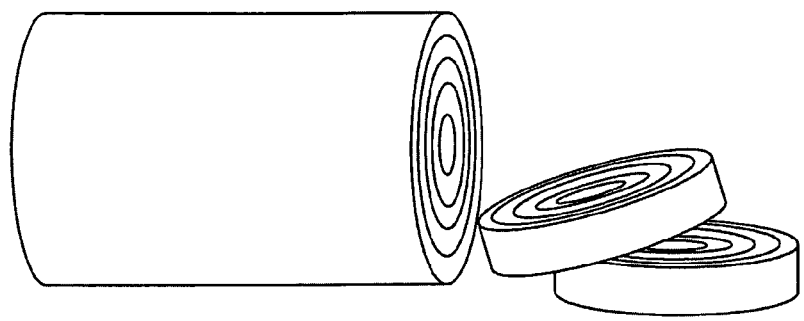
FIG. 5 depicts cylindrical, oriented graphite, either graphite fiber or multiwalled carbon nanotube (MWNT), and platelet sections sliced from an end thereof.
Figure 6:
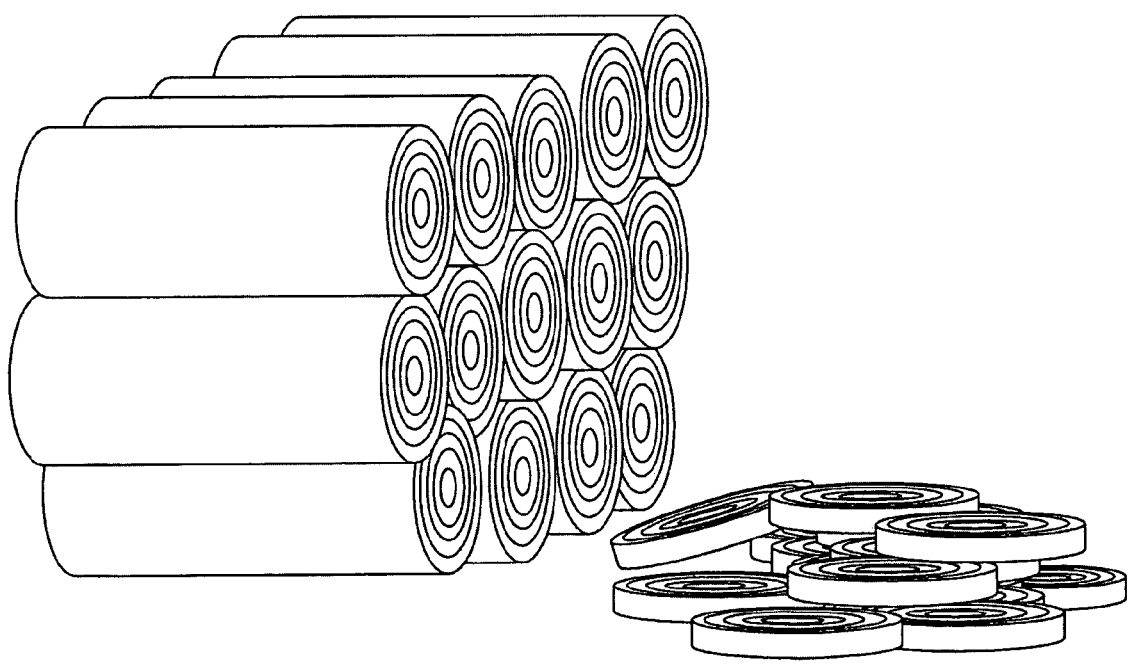
FIG. 6 depicts a plurality of M'WNT bundled for ease of manipulation and the corresponding plurality of sliced from an end of the bundle.

In an embodiment, oriented, pyrolitic graphite fibers (i.e. carbon fibers), instead of single crystal graphite, provide the source material the graphite powder. Carbon fibers confer a benefit in being far less expensive than single crystal graphite. In this process, graphite fibers as shown in FIG. 5 or bundles of them, as shown in FIG. 6, which typically have the basal plane oriented in the fiber direction, are sliced by a microtome in a process similar to that for processing of single crystal graphite. Where the slice thickness is significantly smaller than the fiber diameter, the platelet form factor, or disk, results and no further sizing is required. This has the strong advantage of requiring no further grinding and its associated endpoint targeting.

In a further embodiment, the fibers may be bundled and bound with a thermal conductive polymer or metal prior to cross-sectioning. This eases handling issues and provides a single heat spreader the size of the chip that can be attached through the use of a thermally conductive polymer, solder, or liquid metal.

Figure 7:
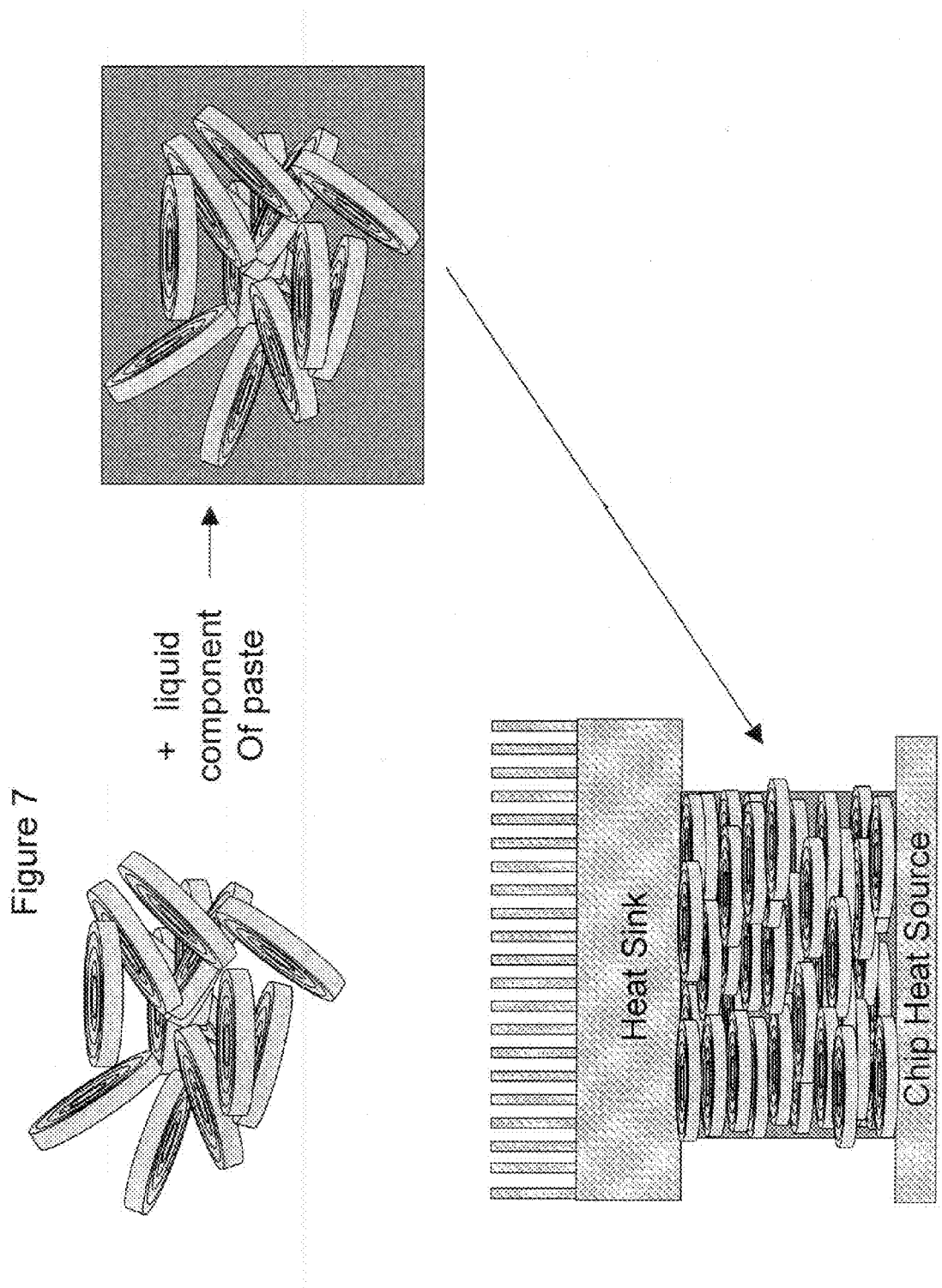
FIG. 7 depicts randomly oriented MWNT plates formed into a pastes and applied in an oriented manner in the gap between a chip heat source and a heat sink.

In an alternative embodiment, multiwall carbon nanotubes (MWNT) serve as the source material. Carbon nanotubes, as do carbon fibers, have the equivalent of a graphitic-plane running in the axial direction. Bundles of multiwalled nanotubes are sectioned perpendicularly to the axial direction. The ratio of the diameter to the thickness of the slice is chosen to yield the desired aspect ratio, causing the vast majority of the slices to orient with the high conductivity direction being in line with the desired thermal path. Oriented carbon fibers and MWNT have thermal conductivities of about 1000 W/in K, about a factor of 2 lower than for single crystal graphite. However, these carbon forms provide handling advantages that may outweigh the lower conductivity. FIG. 7 illustrates schematically the thermal interface material made from these disks mixed with a liquid medium and applied between the heat source and heat sink.

Graphene films may be the source of oriented graphite. The preparation of graphene from highly oriented pyrolytic graphite has been reported in Science [306 Science 666 (2004)]. Rolling graphene into a cylinder and taking transverse sections will properly orient the basal plane.

In an embodiment, the graphite is enriched in $^{12}$C. In an embodiment, the graphite comprises isotopically pure $^{12}$C. It is known that the conductivity of diamond increases with isotopic purity as the percentage of $^{13}$C is reduced. Or, conversely, graphite could be made from isotopically purified $^{13}$C for similar advantage.

Various sectioning methods may be advantageous, depending on the thickness. For the thickest sections, a diamond saw may be used. For sections approximating 10 microns, a microtome may be suitably employed. Lasers may be used to slice graphite and to cut it into appropriately shaped platelets. The cutting of graphite into slices and into x-y shapes and sizes could be facilitated by photolithography, laser ablation, or dicing tools. While very expensive, it would provide high degree of control.

In an embodiment, a chip dicing tool is used to cut shapes on the order of a millimeter on a side from the sliced sheets. Providing precise shapes optimizes packing efficiency. For instance, triangles cut from single crystal graphite sheets will pack with fewer voids than will the needle shapes that result from simple grinding. Suitable shapes include, but are not limited to, squares, hexagons, and other polygons.

Figure 9:
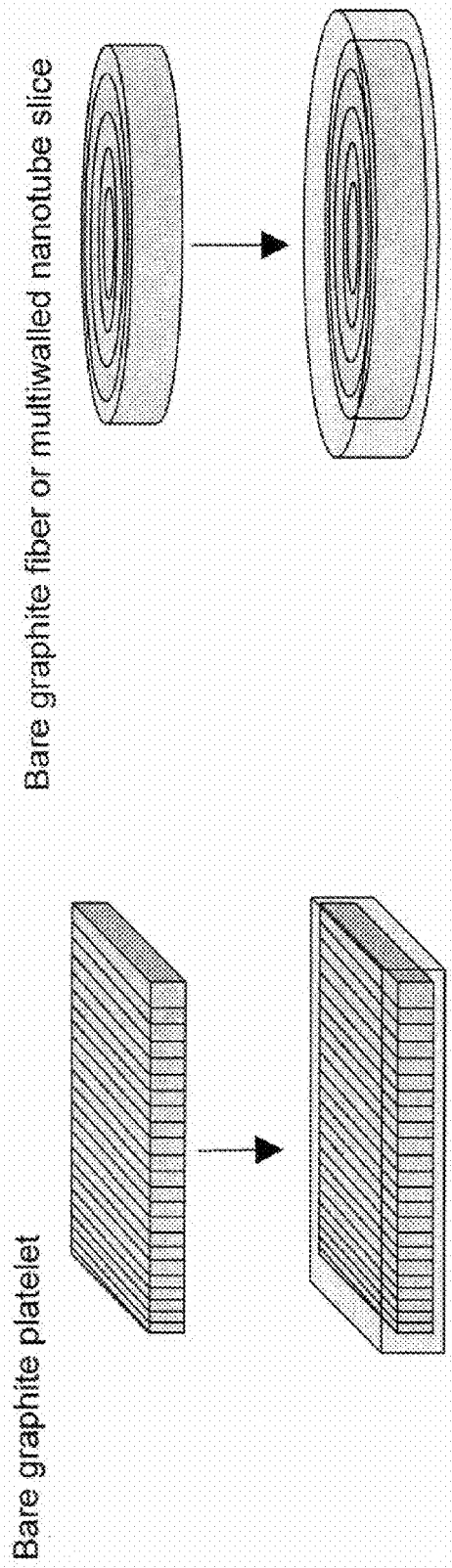
FIG. 9 depicts a bare graphite platelet, a fiber or MWNT plate, before and after coating with a material.

In an embodiment, graphite powders, suitably shaped into platelet and/or disk shapes are coated with a metal or other material, as shown in FIG. 9. Coating the particles confers several advantages, including: a) strengthening the platelets to prevent further cleavage; b) in making the surface more wettable to the liquid matrix; c) making the surface more compatible with a solder matrix both in terms of wetting and fusing; and d) making the surface optimum for the surfactant and medium of liquid suspensions. Such a coating may advantageously be a thin layer of a metal, such as, but not limited to, copper, gold, nickel, solder, and low melting metals. Such a coating may also comprise any commonly used surfaces and surface treatments such as, but not limited to plasma oxidation, plasma sulfonation, ozone treatments in the presence or absence of ultraviolet light, alkaline surface hydrolysis, silanation, (treatment with any number of silane containing substances such as hexamethyl silyl disilizane, or trimethoxysilylpropyl amine), and plasma ammonia treatment. Copper surfaces may advantageously be treated with benzotriazole (BTA). Silver and gold surfaces may benefit from treatment with an alkane thiol. Silicon, silica, or oxide surfaces may be treated by silanation such as treating with trimethoxysilylpropyl amine. This coating could be deposited by such methods as CVD while the powders are suspended in a fluidized bed reactor, by electroless or electroplating, by dipping and drying, by plasma processing, or by other suitable means.

Figure 8:
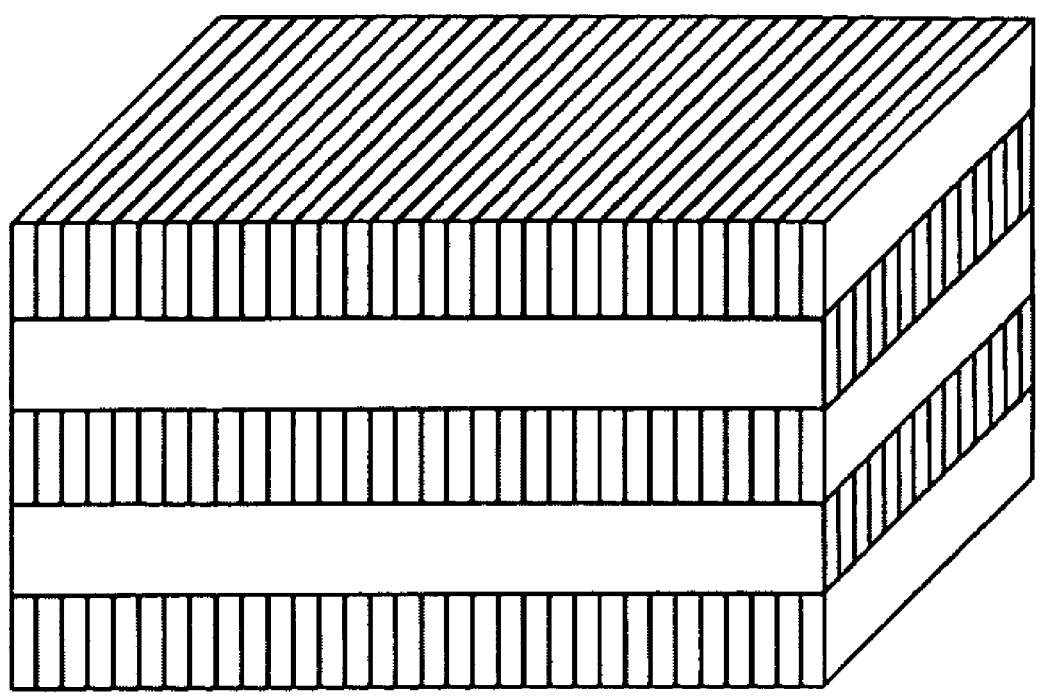
FIG. 8 depicts a stack comprising a plurality of graphite platelet, each rotated 90° with respect to an adjacent platelet.

In an embodiment, the platelets are coated with a metal. The metal may be an alloy or multiple layers of metal. Multiple layers of dissimilar metals may be beneficial especially if they are precursors to an alloy such as a tin coating over a copper coating over the graphite plate. This is because once these are in place between the heat source and heat sink, they may be heated once above the melting point of the lowest melting component metal which will then cause alloy formation and solidification if the alloy melt point is higher. This will fuse particles. In an alternative embodiment, a portion of the particles, preferably one half are coated with one constituent metal of an alloy, for example tin, and another portion (in this example, the other half) of the particles are coated with the other constituent metal of an alloy, in this example, copper. The particles are randomly mixed in the paste, and applied to the gap between the heat source and heat sink, and any solvent is removed by drying. Upon heating above the temperature of the lowest melting point of these two metals, alloy formation will ensue, and form a bond between the majority of particles providing a solid mass.

Where single crystal graphite sliced are used (as shown in FIG. 3), there is an advantage to stacking the slices as shown in FIG. 8. The stacked slices may have alternating or random angular orientations. The stacked slices are adhered, preferably, but not limited to a material having a high thermal conductivity. This aligns the basal planes in the z-direction and produces a multilayered composite with much greater resistance to cracking. This resistance to cracking is the result of the basal plane being oriented always in the z-direction always but randomly in the x and y directions. So, crack propagation would be arrested at each stacked layer. This would allow grinding to the desired average particle size in the x-y dimension without the formation of needle structures. Elimination of needle structures also confers rheological performance benefits. In an embodiment, single layers of graphite are stacked in alternating or random directions between thin metal sheets and laminated. The sheets may comprise any metal, such as, but not limited to, copper, gold, or nickel.

In a preferred embodiment, the graphite powder materials are mixed with a liquid medium to form a paste. In an embodiment, the liquid comprises a liquid metal such as gallium. In an embodiment, the liquid metal comprises a gallium/indium eutectic. In an embodiment, the liquid metal comprises a gallium/indium/tin eutectic. In an embodiment, the liquid is an oil. In an embodiment the liquid is any of PAO oils, low melt waxes, oils, solvents, and adhesives. A preferred oil is a polyalphaolefin (PAO) oil.

Such a paste would then be applied in between the heat source (chip) and the heat sink to facilitate heat transfer. Paste processing and transfer to the chip can be done using an optimized highly concentrated suspension of platelets. Transfer can be accomplished by shearing the paste in such a way that favorable arrangement of the particles occurs. The shear and subsequent particle alignment of minimized particle interactions has the tendency to form 2-D rather than 3-D structures or in other words to align the constituent particles such that their flat faces were flat against all mating surfaces which would maximize the orientation of the basis planes to each other and to the planes of the chip and heatsink. The phenomenon is observable though shear thinning behavior of the paste, or a decrease in viscosity with increasing shear rate.

In an alternative embodiment, a low melt solder forms the matrix between the conducting graphite platelets. In such embodiments, a paste is formed with appropriate graphite powder and molten solder. The paste is applied between the heat source and sink and heated above its melting temperature during the assembly process. After assembly the solder paste solidifies upon cooling and retains the three-dimensional shape of the gap. This is very important because chip modules are often highly non-planar because of module camber. In addition to camber on single chips, multichip modules contain numerous chips that are preferably cooled with a single solution. The thermal spreaders must be attached to chips of varying heights, making an exact fit between the chip and hat difficult. Since the gap can adopt a non-predictable shape because of the camber or variations in chip height, it can only be effectively filled by either a paste that remains fluid during use or by a solid that was molded in place for that individual module.

In yet a further embodiment, graphite particles are dispersed in a volatile liquid to create a paste. Such a paste is delivered to the gap between the chip and the heatsink by normal paste dispense methods. The volatile liquid media (solvent) is then evaporated under vacuum and/or heat leaving behind a compacted collection of the particles which have been formed into the exact shape of the gap including all non-uniformities arising from module camber. This now-dry compacted collection of graphite (for example) microplatelets could then be contacted with a low melt solder. The solder would wick into the powder, and upon cooling solidify the composite mass which would be highly thermally conductive and perfectly conformed to the shape of the gap.

Figure 10:
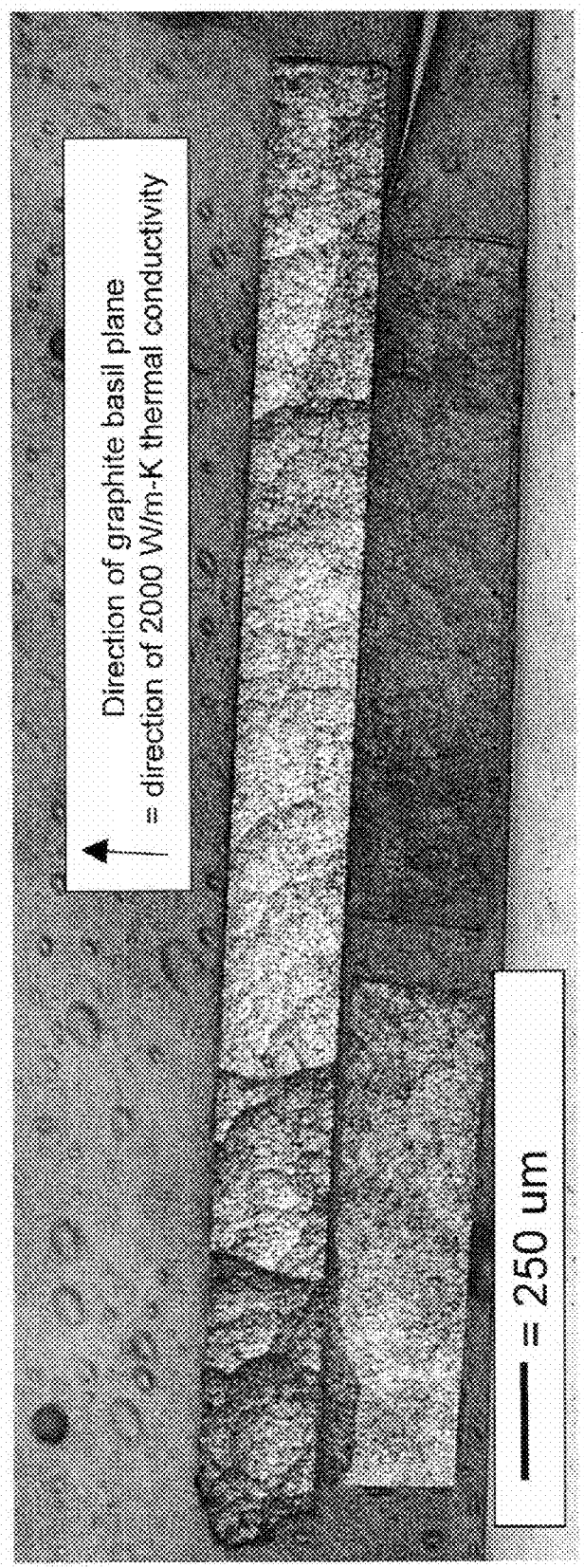
FIG. 10 is an optical micrograph of graphite plates mixed with epoxy.

An experiment was carried out to demonstrate that platelets would indeed self orient with the graphitic plane parallel to the desired direction of heat flow (perpendicular to the chip and heat sink plane). A single crystal graphite disk with a 1.5 inch diameter was sawed into a disk only 10 mils thick where the basil plane was perpendicular to the plane of the disk. This was then diced in a chip dicing tool into rectangles no smaller than 1.5 mm in dimension. A collection of these rectangular (mostly square) pieces were then mixed randomly in an epoxy glue and allowed to settle as the glue was hardening. FIG. 10 demonstrates that the disks indeed laid flat and stacked as desired proving the concept of self orientation. The figure shows a cross section of graphite blocks 250 um thick by 1 to 5 mm long and wide. The graphite basal plane is oriented in the z-direction. These blocks were mixed randomly into epoxy and allowed to settle. Very close and parallel stacking is observed, leading to effective z-direction thermal conductivity through the stack.

The present invention is applicable to materials other than graphite. For instance, there would be a thermal conductivity advantage to microtome slicing of very small diameter copper wire. This would result in disk shaped particles that would stack providing a dramatically increased surface area (plane to plane) contact from one particle to the next relative to the point to point contact that jagged randomly shaped copper particles have. Copper wire can be purchased in very fine (1 mil) and smaller diameters. Microtoming could be performed on large bundles making the fabrication of bulk quantities of copper disks feasible. While copper is not isotropic, the disk shapes would ensure good stacking in a paste application.

Having thus described our invention, what we claim as new, and desire to secure by Letters Patent is:

1. A paste composition having anisotropic thermal transmission character comprising:
    graphitic platelets of a material having a basal plane in a z-direction with a first length and a platelet plane having second and third lengths in an x- and a y-direction respectively, said second and third lengths larger than said first length; wherein the basal plane of the graphitic platelets are aligned in the z-direction; and
    a liquid.

2. The paste composition of claim 1, wherein said platelets have an aspect ratio of at least 2:1.

3. The paste composition of claim 1, wherein said platelets have an aspect ratio of at least 5:1.

4. The paste composition of claim 1, wherein said first length is from about 1 micron to about 50 mils.

5. The paste composition of claim 1, wherein said liquid is selected from the group consisting of liquid metals and oils.

6. The paste composition of claim 5, wherein said oil is a polyalphaolefin oil.

7. The paste composition of claim 5, wherein said liquid metal is selected from the group consisting of gallium, gallium/indium alloys, gallium/indium/tin alloys, and molten solder.

8. The paste composition of claim 1, wherein said graphite consists essentially of isotopically-pure carbon $^{12}$C.

9. The paste composition of claim 1, wherein said graphite is coated with a metal.

10. The paste composition of claim 9, wherein said metal is selected from the group consisting of copper, gold, silver, nickel, titanium, chromium, tin, bismuth, solders, and alloys.

11. The paste composition of claim 1, wherein said graphite is provided a surface treatment.

12. The paste composition of claim 11, wherein said surface treatment is selected from the group consisting of plasma oxidation, plasma sulfonation, ozone treatments in the presence or absence of ultraviolet light, alkaline surface hydrolysis, silanation, and plasma ammonia treatment.

13. The paste composition of claim 9, wherein said metal is provided a surface treatment.

14. The paste composition of claim 13, wherein said metal surface treatment is selected from the group consisting of benzotriazoles, alkane thiols, and silanation.

* * * * *